United States Patent [19]

Sakai et al.

[11] Patent Number: 5,466,330
[45] Date of Patent: Nov. 14, 1995

[54] HANDLING APPARATUS FOR CERAMIC GREEN SHEET

[75] Inventors: Norio Sakai; Tsuyoshi Saitoh; Yoshikatsu Nakayama; Akihiko Kamada, all of Kyoto, Japan

[73] Assignee: Murata Manufacturing Co., Ltd., Japan

[21] Appl. No.: 182,286

[22] Filed: Jan. 14, 1994

[30] Foreign Application Priority Data

Jan. 14, 1993 [JP] Japan ................................. 5-004755

[51] Int. Cl.⁶ ............................................. B32B 35/00
[52] U.S. Cl. ...................... 156/584; 156/247; 156/344
[58] Field of Search ................................ 156/584, 247, 156/344

[56] References Cited

U.S. PATENT DOCUMENTS 4,685,991  8/1987  Herrmann et al. ................. 156/584 X
5,104,473  4/1992  Tveit et al. ......................... 156/584 X
5,282,918  2/1994  Heist et al. ......................... 156/584 X

FOREIGN PATENT DOCUMENTS 63-288721  11/1988  Japan ..................................... 156/584
4325247    11/1992  Japan ..................................... 156/584
1572716     7/1980  United Kingdom .................... 156/584

*Primary Examiner*—David A. Simmons
*Assistant Examiner*—M. Curtis Mayes
*Attorney, Agent, or Firm*—Ostrolenk, Faber, Gerb & Soffen

[57] ABSTRACT

Before ceramic green sheets formed on carrier films, which are prepared for manufacturing a ceramic multilayer circuit board, are stacked with each other, each carrier film is separated from each ceramic green sheet, which is maintained in a state being attracted by an attracting head. This separation is rendered to gradually extend over the entire region from an end of the ceramic green sheet.

8 Claims, 9 Drawing Sheets

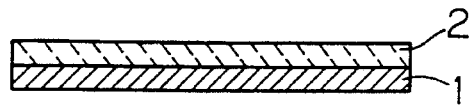
FIG.12A PRIOR ART
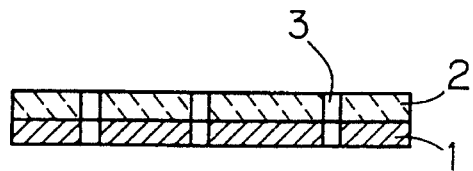
FIG.12B PRIOR ART
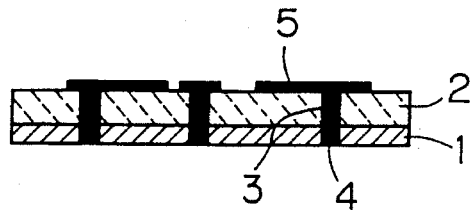
FIG.12C PRIOR ART
FIG.12D PRIOR ART
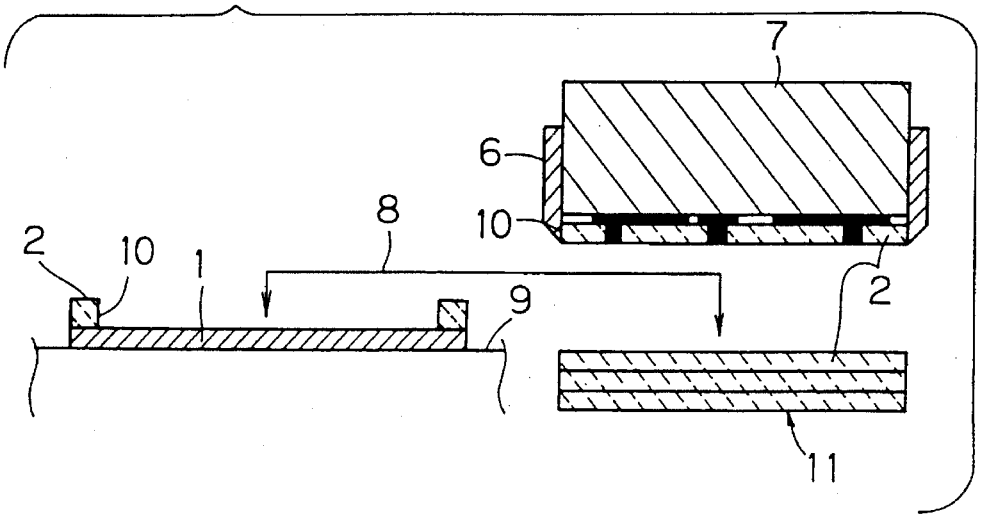

HANDLING APPARATUS FOR CERAMIC GREEN SHEET

BACKGROUND OF THE INVENTION

1. Field of the Invention

The present invention relates to a method of manufacturing a ceramic multilayer circuit component including a ceramic multilayer circuit board, or a ceramic multilayer electronic component having a ceramic multilayer structure such as a hybrid IC, an LC composite part or a multilayer ceramic capacitor, and a handling apparatus for a ceramic green sheet which is advantageously employed in this method.

2. Description of the Background Art

FIGS. 12A to 12D show some steps which are included in a known method of manufacturing a ceramic multilayer circuit board as an exemplary ceramic multilayer circuit component.

First, a ceramic green sheet 2 is formed on a carrier film 1 of resin or the like by a doctor blade or the like as shown in FIG. 12A, and then dried. After such formation, the ceramic green sheet 2 may be cut into prescribed dimensions with the carrier film 1, if necessary.

Then, holes 3 for defining via holes are provided in the ceramic green sheet 2, which is still lined with the carrier film 1, by a punch or a drill, as shown in FIG. 12B. The holes 3 pass not only through the ceramic green sheet 2 but through the carrier film 1.

Then, conductor paste 4 is filled up in the respective holes 3 by screen printing or the like while forming wiring patterns 5 as shown in FIG. 12C, and then dried.

Then, the ceramic green sheet 2 is separated from the carrier film 1, and stacked on other ceramic green sheets 2 along prescribed order, as shown in FIG. 12D. More specifically, a suction head 7 which is enclosed with cutting edges 6 is employed. The cutting edges 6, which are vertically movable with respect to the suction head 7 within a prescribed range, are downwardly urged by a spring (not shown). Such a suction head 7 is reciprocative along arrow 8. On the other hand, the carrier film 1 which is provided with the ceramic green sheet 2 is placed on a suction stage 9.

The cutting edges 6 are first downwardly moved with the suction head 7 toward the ceramic green sheet 2 which is placed on the suction stage 9. At the same time, the cutting edges 6 define a kerf 10 in the ceramic green sheet 2. In this case, the cutting edges 6 may slightly penetrate into the carrier film 1. After the kerf 10 is defined, the suction head 7 attracts the ceramic green sheet 2, to separate the ceramic green sheet 2 from the carrier film 1 following upward movement thereof. Thereafter the suction head 7 is moved along arrow 8, to stack the ceramic green sheet 2 successively on other ceramic green sheets 2 in a prescribed position.

Thereafter a laminate 11 of the ceramic green sheets 2 obtained in the aforementioned manner is pressed and cut if necessary, and thereafter fired to provide a desired ceramic multilayer circuit board.

The aforementioned manufacturing method is applied not only to a ceramic multilayer circuit board, but to other ceramic multilayer circuit components. Such ceramic multilayer circuit components include an IC package 13 comprising a cavity 12, as shown in FIG. 13. In order to manufacture such an IC package 13 or the like, a method similar to that for the aforementioned ceramic multilayer circuit component is applied and a ceramic green sheet 2a which is already provided with a hole 14 for defining the cavity 12 as shown in FIG. 14 is employed in a step of successively stacking such ceramic green sheets. Conductive paths such as via holes and wiring patterns are omitted from FIGS. 13 and 14.

However, the ceramic green sheet provided with a hole for defining a cavity may encounter the following problems in handling, particularly when the same is separated from the carrier film:

First, the carrier film is indispensable for facilitating handling of a thin, i.e., mechanically soft ceramic green sheet of several 10 μm in thickness, and for inhibiting the ceramic green sheet from crumpling and contraction dispersion in drying after filling of via holes with conductor paste or printing of wiring patterns. Consequently, the carrier film must be separated from the ceramic green sheet, before the ceramic green sheet is stacked on a plurality of other ceramic green sheets.

When the suction head 7 shown in FIG. 12D is applied to the ceramic green sheet 2a shown in FIG. 14 which is provided with the hole 14 for defining a cavity, however, it may be impossible to separate the ceramic green sheet 2a from a carrier film 1 due to insufficient suction. Further, the ceramic green sheet 2a which is provided with the hole 14 for defining a cavity is so mechanically soft that a corner portion of the hole 14 may be undesirably cut upon separation from the carrier film 1. In addition, the as-separated ceramic green sheet 2a may be crumpled when the same is attracted by the suction head 7.

The aforementioned problems caused in separation are not specific to the ceramic green sheet 2a shown in FIG. 14, which is provided with the hole 14 for defining a cavity. When an extremely thin ceramic green sheet of not more than 10 μm in thickness is employed or large force is required for separating a ceramic green sheet from a carrier film, for example, the ceramic green sheet may be hard to separate or the as-separated ceramic green sheet may be crumpled, even if the ceramic green sheet is provided with no hole for defining a cavity. Therefore, the problems in separation are also serious in manufacturing of a miniature ceramic multilayer circuit component, which must have high accuracy in stacking of ceramic green sheets.

SUMMARY OF THE INVENTION

Accordingly, an object of the present invention is to provide a method of manufacturing a ceramic multilayer circuit component and a handling apparatus for a ceramic green sheet, which can solve the aforementioned problems caused in a step of separating a mechanically soft ceramic green sheet from a carrier film.

In order to solve the aforementioned technical problems, the method of manufacturing a ceramic multilayer circuit component according to the present invention comprises the steps of forming a ceramic green sheet on a carrier film, applying conductive paste for supplying a conductive path to the ceramic green sheet, then attracting the ceramic green sheet with the carrier film by an attracting head, separating the carrier film from the ceramic green sheet so that the as-separated portion gradually extends over the entire region from one end of the ceramic green sheet, and moving the attracting head thereby successively stacking such ceramic green sheets.

In the aforementioned method, the ceramic green sheet which is formed on the carrier film is preferably provided with a rectangular kerf. The carrier film is separated from the ceramic green sheet, which is attracted by the attracting head, while being held on a portion which is outward beyond one corner of a rectangle defining the kerf. Thus, the as-separated portion gradually extends over the entire region diagonally or substantially diagonally from one corner portion of a rectangular part, which is enclosed with the kerf.

The present invention also provides a handling apparatus for a ceramic green sheet, which can be advantageously employed in the aforementioned method of manufacturing a ceramic multilayer circuit component. This handling apparatus for a ceramic green sheet is adapted to separate a carrier film from a rectangular ceramic green sheet which is formed thereon, and comprises an attracting head for attracting the ceramic green sheet with the carrier film, a holding member for holding the carrier film on a position corresponding to one corner portion of the ceramic green sheet, and a mechanism for relatively moving the attracting head and the holding member along a diagonal direction or a substantially diagonal direction of the ceramic green sheet.

Preferably, the aforementioned handling apparatus further comprises a separation auxiliary plate for forcibly folding a separated portion of the carrier film with respect to an unseparated portion through a folding line.

Further, the mechanism for relative movement preferably comprises a mechanism for moving the attracting head in a first direction and another mechanism for moving the holding member in a second direction intersecting with the first direction.

In the aforementioned method of manufacturing a ceramic multilayer circuit component, the ceramic green sheet is still lined with the carrier film when the same is attracted by the attracting head, and the carrier film is separated from the ceramic green sheet which is maintained in a state being attracted by the attracting head. Even if force is applied to the ceramic green sheet to undesirably deform the same in separation of the carrier film, therefore, the ceramic green sheet can be maintained in a proper shape along the attracting head.

In a preferred embodiment of the aforementioned method and the handling apparatus for a ceramic green sheet according to the present invention, a carrier film is separated from a rectangular ceramic green sheet diagonally or substantially diagonally from one corner portion of the ceramic green sheet. Therefore, the separation is started with small force, to smoothly proceed after such starting.

According to the present invention, as hereinabove described, the carrier film is separated from the ceramic green sheet which is attracted by the attracting head, whereby it is possible to prevent the ceramic green sheet from crumpling or imperfect separation in separation of the carrier film even if the ceramic green sheet is mechanically soft due to a hole for a cavity or an extremely small thickness. Thus, it is possible to accurately and efficiently carry out the following step of stacking such ceramic green sheets.

Further, the carrier film is so separated from the ceramic green sheet that the as-separated portion gradually extends over the entire region from an end of the ceramic green sheet, whereby such separation can be carried out with no problem even if the ceramic green sheet is in contact with the carrier film with relatively large adhesion. When holes for defining via holes are provided to pass through the ceramic green sheet and the carrier film and filled up with conductor paste, for example, it is difficult to separate the carrier film from the ceramic green sheet due to action of the conductor paste. According to the present invention, however, it is possible to smoothly separate the carrier film from the ceramic green sheet also in this case. While a mold releasing agent is generally applied onto a carrier film to facilitate separation, it is possible to omit such a mold releasing agent according to the present invention since the carrier film can be smoothly separated with no particular requirement for the mold releasing agent, whereby the carrier film can be reduced in cost.

In the preferred embodiment of the method and the handling apparatus for a ceramic green sheet according to the present invention, further, separation of the carrier film is started from one corner portion of the rectangular ceramic green sheet, whereby smooth starting of the separation can be expected. Thus, it is possible to inhibit the carrier film from application of irregular force, thereby preventing the ceramic green sheet from undesired deformation.

When a mechanism for relatively moving the attracting head and the holding member is formed by a mechanism for moving the attracting head in a first direction and that for moving the holding member in a second direction intersecting with the first direction in a preferred embodiment of the inventive handling apparatus for a ceramic green sheet, it is possible to quickly separate the carrier film so that the as-separated portion gradually extends to the entire region diagonally or substantially diagonally from one corner portion of the rectangular ceramic green sheet, thereby improving productivity of the ceramic multilayer circuit component.

When a separation auxiliary plate is provided in opposition to the attracting head in the aforementioned preferred embodiment of the inventive handling apparatus for a ceramic green sheet for forcibly folding a separated portion of the carrier film with respect to an unseparated portion through a folding line, it is possible to reduce force which is required for the separation. When holes for defining via holes are provided to pass through the ceramic green sheet and the carrier film and filled up with conductor paste, the conductor paste which is filled up in the holes provided in the ceramic green sheet may generally be disadvantageously transferred to those provided in the carrier film, due to its viscosity. However, it is possible to eliminate such inconvenience by separating the carrier film from the ceramic green sheet while forming a folding line in the carrier film in the aforementioned manner. The aforementioned inconvenience is easily caused particularly when the ceramic green sheet has a small thickness and the holes for defining via holes have large diameters. Also in this case, however, it is possible to advantageously eliminate the inconvenience according to the present invention. Thus, it is possible to maintain high reliability in conduction of the as-obtained ceramic multilayer circuit component while widening the range of design in relation to the thickness of the ceramic green sheet and the diameters of the via holes, which have been restricted for avoiding such inconvenience, whereby it is possible to increase the degree of freedom in design of a ceramic multilayer circuit board, for example.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A to 12D are sectional views successively showing some steps included in a conventional method of manufacturing a ceramic multilayer circuit board;

DESCRIPTION OF THE PREFERRED EMBODIMENTS

An embodiment of the present invention is now described with reference to a method of manufacturing a ceramic multilayer circuit board provided with a cavity, i.e., an IC package.

Figure 1A:
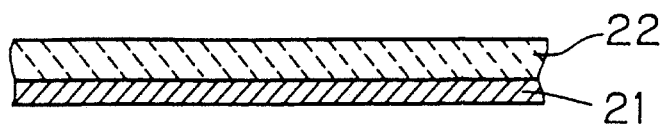
FIGS. 1A to 1E are sectional views successively showing steps included in a method of manufacturing an IC package according to an embodiment of the present invention.

As shown in FIG. 1A, a ceramic green sheet 22 is formed on a carrier film 21 of polyethylene terephthalate, for example, by a doctor blade or the like, and then dried.

Figure 1B:
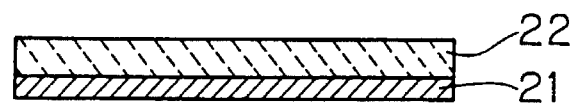

Then, the ceramic green sheet 22 is cut into prescribed dimensions with the carrier film 21 if necessary, as shown in FIG. 1B. This cutting step is carried out by punching with a die, or cutting with a blade, for example.

Figure 1C:
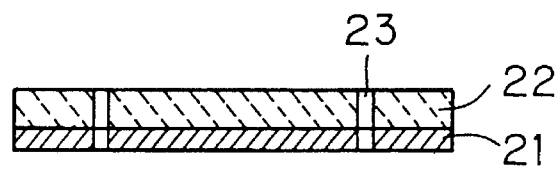

Then, holes 23 for defining via holes are formed in the ceramic green sheet 22, which is still lined with the carrier film 21, with a punch or a drill, as shown in FIG. 1C. The holes 23 pass not only through the ceramic green sheet 22 but through the carrier film 21.

Figure 1D:
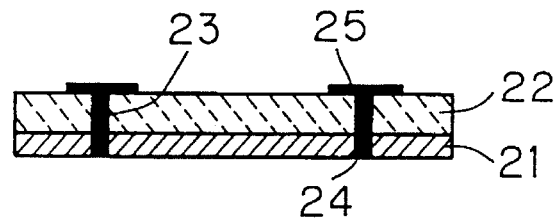

Then, the holes 23 are filled up with conductor paste 24 by screen printing or the like while wiring patterns 25 or the like are formed also by the conductor paste 24 as shown in FIG. 1D, and then the conductor paste 24 is dried. The steps of filling up the holes 23 with the conductor paste 24 and forming the wiring patterns 25 by the conductive paste 24 may be simultaneously or separately carried out. The wiring patterns 25 include those forming circuits as well as those forming passive components such as capacitors or inductances.

Figure 1E:
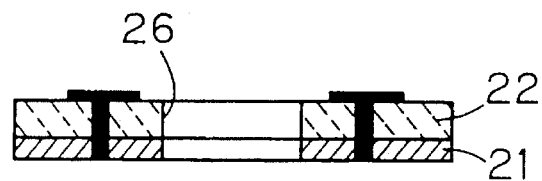

Then, a cavity hole 26 for defining a cavity is provided in the ceramic green sheet 22, as shown in FIG. 1E. This cavity hole 26 passes not only through the ceramic green sheet 22, but through the carrier film 21.

The order of the steps shown in FIGS. 1C to 1E is arbitrarily changeable.

Figure 2:
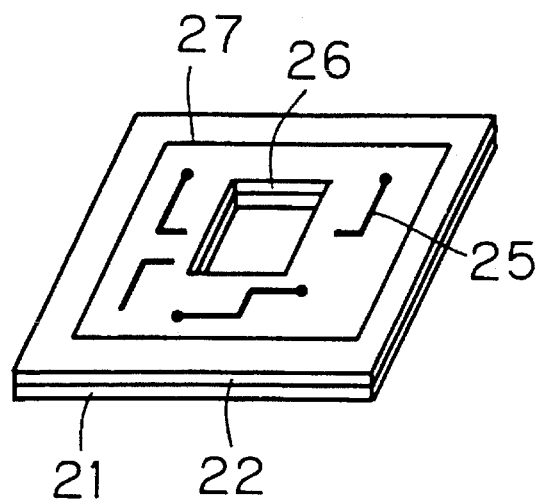
FIG. 2 is a perspective view showing a state of a ceramic green sheet 22 which is provided with a kerf 27 after the step shown in FIG. 1E.

Then, a rectangular kerf 27 is formed inside the outer peripheral edges of the ceramic green sheet 22, as shown in FIG. 2. FIG. 2 shows plane shapes of the aforementioned wiring patterns 25. The holes 23 for defining via holes are located under the conductor paste 24 forming the wiring patterns 25.

Figure 3:
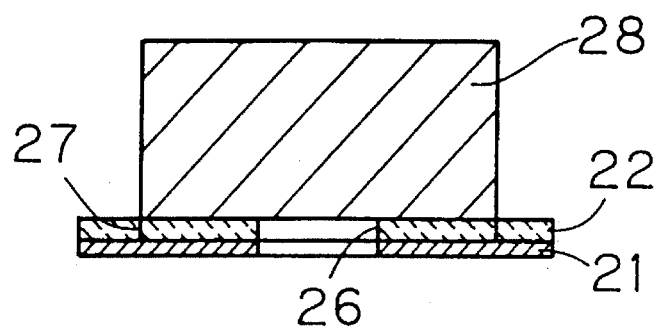
FIG. 3 is a sectional view showing a step of attracting the ceramic green sheet 22 with an attracting head 28, which is carried out after the step shown in FIG. 2.

Then, the ceramic green sheet 22 is attracted by an attracting head 28 with the carrier film 21, as shown in FIG. 3. While the attracting head 28 attracts the ceramic green sheet 22 on the basis of vacuum suction, for example, attraction by a magnet may alternatively be applied if the ceramic green sheet 22 contains a magnetic substance. An attracting surface of the attracting head 28 has an outline which is substantially identical in size to the aforementioned rectangular kerf 27. However, the attracting surface of the attracting head 28 may be in excess of the kerf 27 in size. Further, the attracting surface of the attracting head 28, which is illustrated as a flat surface in the embodiment, may alternatively be formed by a curved surface.

Figure 4:
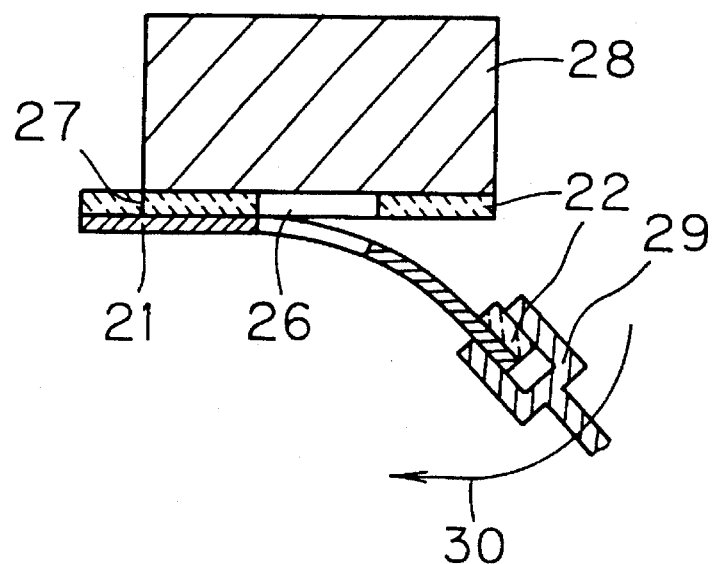
FIG. 4 is a sectional view showing a step of separating a carrier film 21, which is carried out after the step shown in FIG. 3.

Then, an end of the carrier film 21 is held by a chuck 29 with a portion of the ceramic green sheet 22 which is outward beyond the kerf 27 while the ceramic green sheet 22 is attracted by the attracting head 28, and the chuck 29 is moved along arrow 30, as shown in FIG. 4. In response to this, the carrier film 21 is separated from the ceramic green sheet 22. This separation proceeds gradually from an end of the ceramic green sheet 22, which is enclosed with the kerf 27, to the overall region.

Then, the attracting head 28 is moved to stack the ceramic green sheet 22 successively on other sheets. Thus obtained is an IC package 31 or the like, which has a sectional shape shown in FIG. 5. The IC package 31 or the like is provided with a cavity 32 which is defined by an assembly of the aforementioned cavity holes 26. A proper electronic component such as an IC (not shown) is stored and fixed in this cavity 32, to be electrically connected with the wiring patterns 25 and the like by wire bonding or the like.

In the aforementioned embodiment, the chuck 29 grasps not only an end of the carrier film 21 but the portion of the ceramic green sheet 22 which is outward beyond the kerf 27 as shown in FIG. 4 for separating the carrier film 21 from the ceramic green sheet 22. Alternatively, the attracting head 28 may attract the entire ceramic green sheet 22 including the portion which is outward beyond the kerf 27, so that only the carrier film 21 is separated from the ceramic green sheet 22 and the portion outward beyond the kerf 27 is thereafter removed.

While the kerf 27 is provided in the ceramic green sheet 22 in the aforementioned embodiment, it is possible to separate the carrier film 21 with no requirement for such a kerf if the ceramic green sheet 22 is matched in size with the IC package 31 to be obtained in the stage shown in FIG. 1B.

Figure 5:
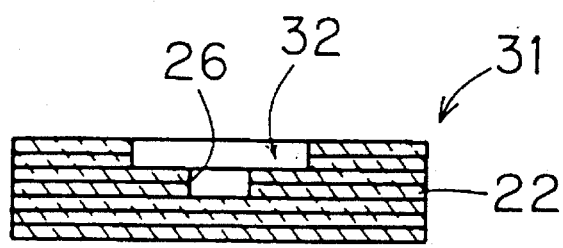
FIG. 5 is a sectional view showing an IC package 31 obtained in a step of stacking ceramic green sheets 22 with each other, which is carried out after the step shown in FIG. 4.

Further, the step shown in FIG. 1B may be omitted so that the IC package 31 shown in FIG. 5 is obtained by carrying out the steps of FIGS. 1C to 1E on the long carrier film 21 and the ceramic green sheet 22 shown in FIG. 1A.

While an end of the carrier film 21 is grasped by the chuck 29 as shown in FIG. 4 in the aforementioned embodiment, the carrier film 21 may alternatively be held by a suction roll or a viscose roll, to be separated from the ceramic green sheet 22.

While the present invention is applied to the ceramic green sheet 22 having the cavity hole 26 in the aforementioned embodiment, the present invention is also applicable to a ceramic green sheet which is provided with no such cavity hole, as a matter of course.

Figure 6A:
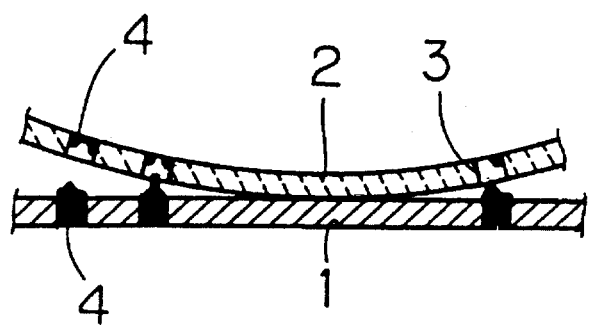
FIGS. 6A and 6B are sectional views showing states of behavior of conductor paste materials, filled up in holes for defining via holes, which are caused when carrier films are separated from ceramic green sheets in the prior art and the embodiment of the present invention respectively.
Figure 6B:
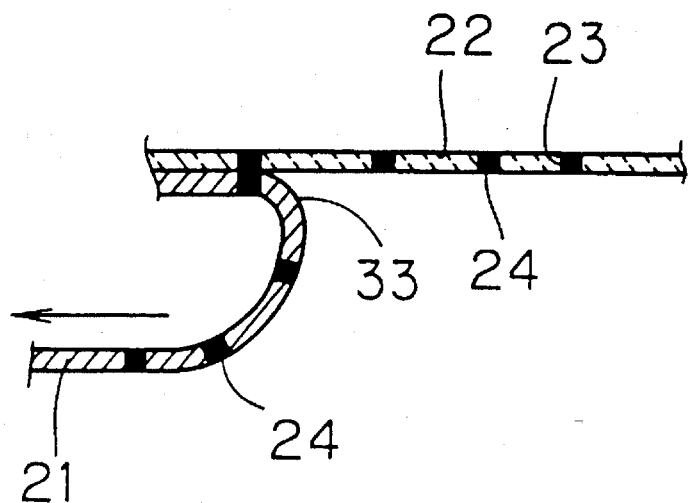

Each of FIGS. 6A and 6B illustrates behavior of conductor paste, which is filled up in holes for defining via holes, caused when a carrier film is separated from a ceramic green sheet. FIG. 6A shows the prior art, and FIG. 6B shows the present embodiment.

When the carrier film 1 is separated from the ceramic green sheet 2 by separation of the suction head 7 and the suction stage 9 as shown in FIG. 12D, parts of the conductor paste 4 which is filled up in the holes 3 provided in the ceramic green sheet 2 may be transferred toward the carrier film 1 as shown in FIG. 6A, since the ceramic green sheet 2 and the carrier film 1 are moved substantially in parallel with each other.

According to this embodiment, on the other hand, a separated portion of the carrier film 21 can be folded with respect to an unseparated portion through a folding line 33 as shown in FIG. 6B, whereby it is possible to prevent the conductor paste 24, which is filled up in the holes 23 provided in the ceramic green sheet 22 from being transferred toward the carrier film 21. Thus, conduction through the via hole is maintained in high reliability while a range of allowance for the ratio of the thickness of the ceramic green sheet 22 to the diameter of each hole 23 is widened as hereinabove described, whereby the ceramic multilayer circuit board, i.e., the ceramic multilayer circuit component, is improved in degree of freedom in design.

Figure 7:
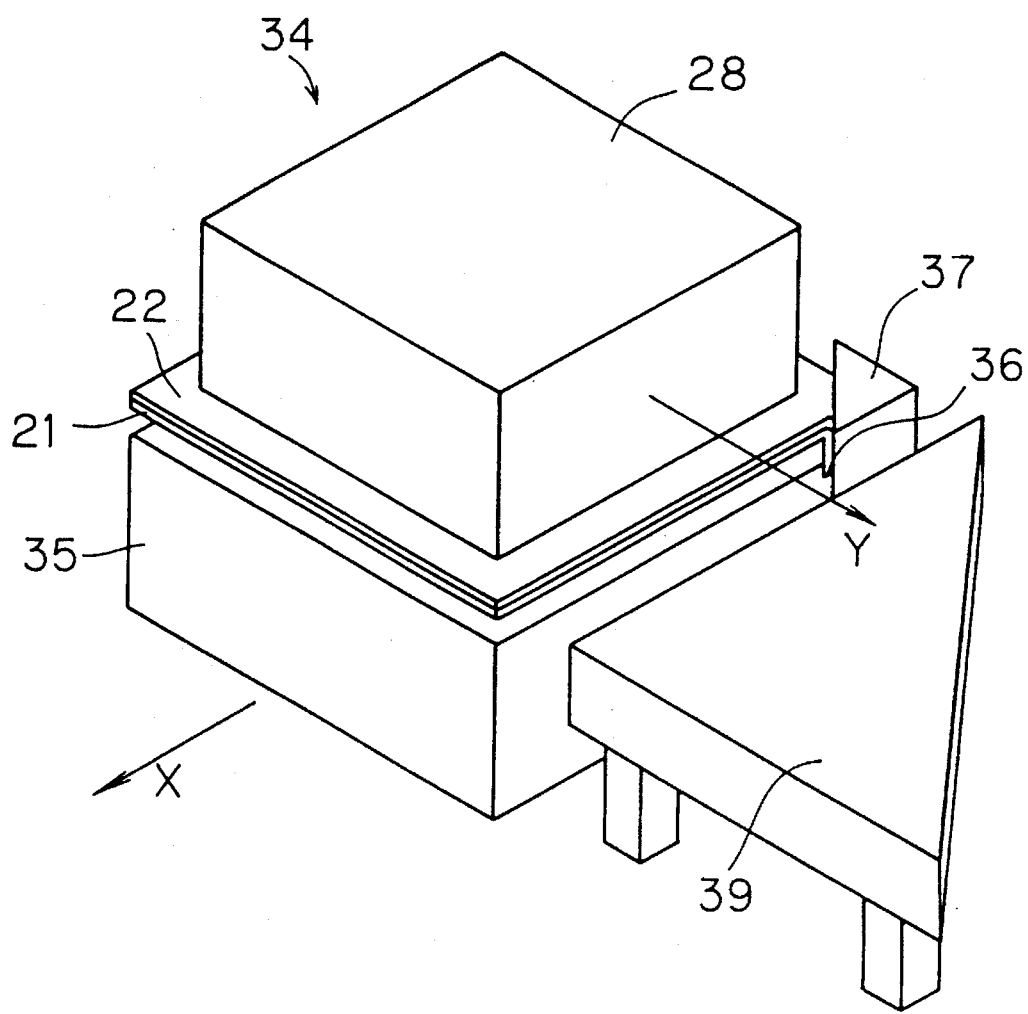
FIG. 7 is a perspective view showing a handling apparatus 34 for a ceramic green sheet which is applied in a preferred embodiment of the present invention.
Figure 8:
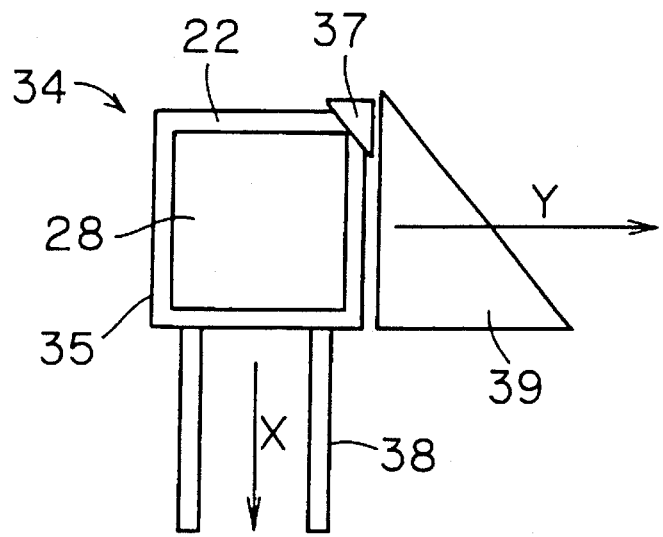
FIG. 8 is a plan view of the handling apparatus 34 shown in FIG. 6.
Figure 9:
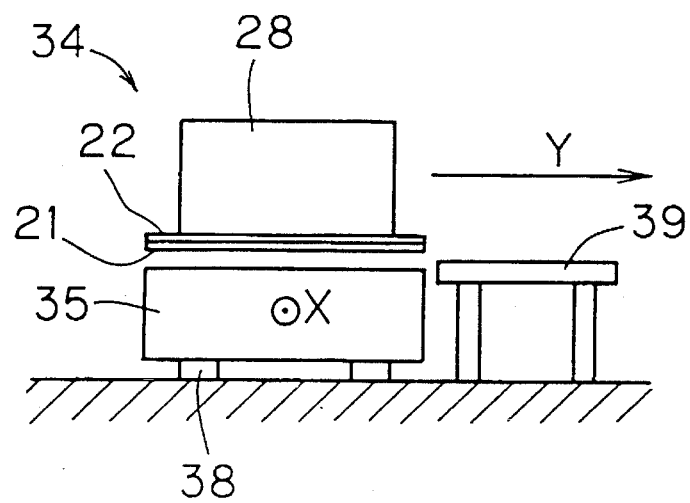
FIG. 9 is a front elevational view of the handling apparatus 34 shown in FIG. 7.

A preferred embodiment of a handling apparatus for a ceramic green sheet for separating a carrier film from a rectangular ceramic green sheet which is formed on the carrier film is now described. FIGS. 7, 8 and 9 are a perspective view, a plan view and a front elevational view showing such a handling apparatus 34. In these figures, elements corresponding to those in the aforementioned embodiment are denoted by the same reference numerals, and redundant description is omitted.

In application of the handling apparatus 34, the aforementioned steps shown in FIGS. 1A to 1E, 2 and 3 are first carried out as such. Therefore, the handling apparatus 34 comprises an attracting head 28 for attracting a ceramic green sheet 22 with a carrier film 21. The handling apparatus 34 also comprises a table 35, in opposition to the attracting head 28. The table 35 is adapted to receive the ceramic green sheet 22 thereon through the carrier film 21, for forming the kerf 27 shown in FIG. 2 in the ceramic green sheet 22. A lower portion 36 (also refer to FIGS. 10 and 11) is provided on a position corresponding to one corner portion of the rectangular ceramic green sheet 22 which is placed on the table 35, and a holding member 37 is provided in relation to the lower portion 36, for holding the carrier film 21 in the position corresponding to one corner portion of the rectangular ceramic green sheet 22. In this embodiment, the holding member 37 holds not only the carrier film 21 but a portion of the ceramic green sheet 22 which is outward beyond the kerf 27, with the lower portion 36. The holding member 37 is vertically movable and adapted to carry out the aforementioned holding operation after the ceramic green sheet 22 is attracted by the attracting head 28.

The aforementioned table 35 is moved in an X-axis direction with the holding member 37. To this end, guides 38 are provided as shown in FIGS. 8 and 9. On the other hand, the attracting head 28 is movable along a Y-axis direction. A separation auxiliary plate 39 is provided on a position which is opposed to the attracting head 28 which is moved in the Y-axis direction.

Figure 10:
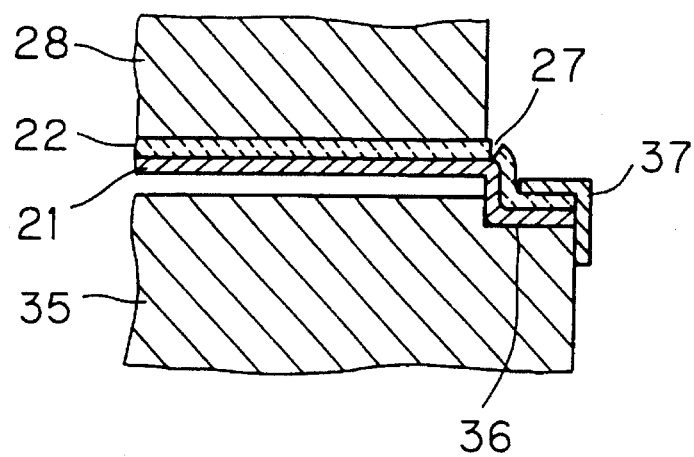
FIG. 10 is a sectional view partially showing a holding member 37 appearing in FIG. 7 and elements related thereto.

In operation of the handling apparatus 34 having the aforementioned structure, the ceramic green sheet 22 is attracted by the attracting head 28 with the carrier film 21, then the carrier film 21 is held by the holding member 37 in the position corresponding to one corner portion of the ceramic green sheet 22, and thereafter the table 35 is moved in the X-axis direction while the attracting head 28 is moved in the Y-axis direction in synchronization with the same, as clearly understood from FIG. 10. Thus, the attracting head 28 and the holding member 37 are relatively moved diagonally or substantially diagonally along the rectangular ceramic green sheet 22, whereby the carrier film 21 is separated from the ceramic green sheet 22. This separation diagonally or substantially diagonally proceeds from an end of the ceramic green sheet 22 toward the overall region.

Figure 11:
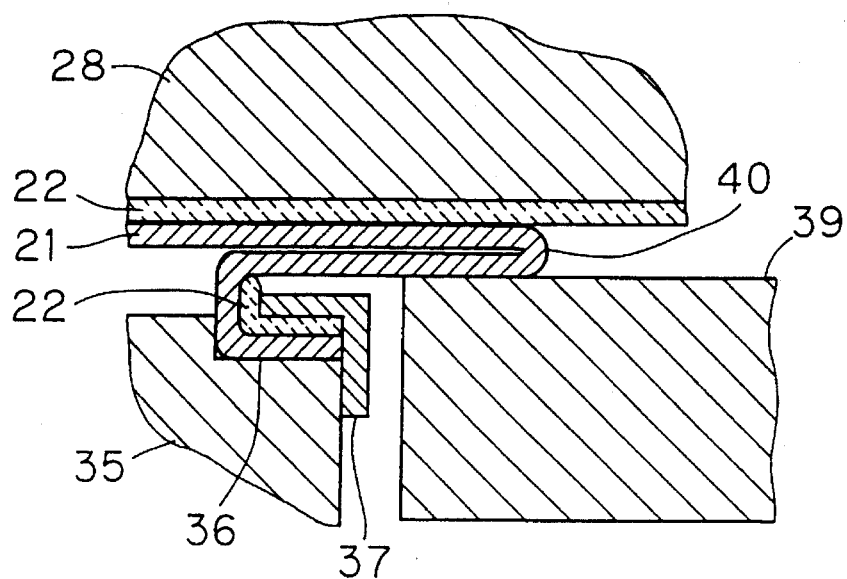
FIG. 11 is a sectional view showing behavior of a carrier film 21 in a separation step carried out by the handling apparatus 34 shown in FIG. 7.
Figure 13:
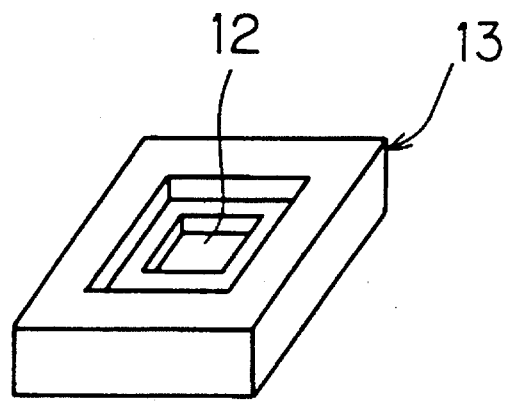
FIG. 13 is a perspective view showing an IC package as an exemplary ceramic multilayer circuit component.
Figure 14:
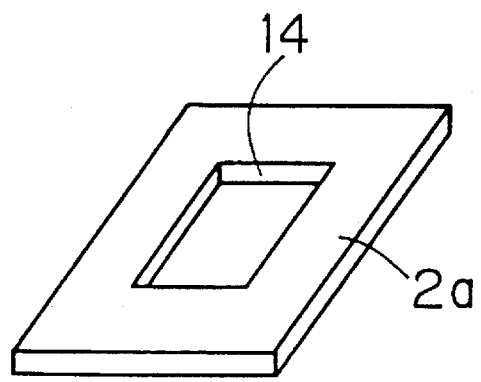
FIG. 14 is a perspective view showing a ceramic green sheet 2a employed for manufacturing the IC package 13 shown in FIG. 13.

In an intermediate stage of the aforementioned separation, the carrier film 21 behaves as shown in FIG. 11. When the attracting head 28 reaches a position which is in opposition to the separation auxiliary plate 39, the separation auxiliary plate 39 forcibly folds the as-separated portion of the carrier film 21 with respect to an unseparated portion through a folding line 40. Due to such behavior of the carrier film 21, it is possible to reduce force which is required for the separation, while the advantages described above with reference to FIGS. 6A and 6B are further effectively attained.

When the separation of the carrier film 21 is started from one corner portion of the rectangular ceramic green sheet 22 as in the aforementioned embodiment, the separation so smoothly progresses that the ceramic green sheet 22 can be prevented from breakage during the separation.

While the ceramic green sheet 22 is attracted by the attracting head 28 after formation of the kerf 27 in the aforementioned embodiment as shown in FIG. 2, the kerf 27 may alternatively be formed simultaneously with attraction of the ceramic green sheet 22 by the attracting head 28 through the suction head 7 having the cutting edges 6 as shown in FIG. 12D, for example, or the same may be formed after attraction of the ceramic green sheet 22 by the attracting head 28.

The handling apparatus 34 is also applicable to a rectangular ceramic green sheet which is not provided with the aforementioned kerf 27 but previously has prescribed dimensions. In this case, the holding member 37 is preferably formed for attracting the carrier film 21 from below on the basis of vacuum suction or adhesion.

While the holding member 37 and the attracting head 28 are moved in directions perpendicular to each other in the aforementioned handling apparatus 34, the directions of such movement may not be perpendicular to each other but may intersect with each other at an angle other than the right angle.

Further, it is not necessary to move both of the holding member 37 and the attracting head 28. Only one of these elements may be so moved that the attracting head 28 and the holding member 37 are relatively moved diagonally or substantially diagonally along the ceramic green sheet 22 as the result.

The present invention is not restricted to a ceramic multilayer circuit board comprising a cavity which is employed as the aforementioned IC package, but is widely applicable to ceramic multilayer circuit components such as a ceramic multilayer circuit board comprising no cavity, a ceramic multilayer electronic component having a ceramic multilayer structure such as a hybrid IC, an LC composite part, a multilayer ceramic capacitor, and the like.

Although the present invention has been described and illustrated in detail, it is clearly understood that the same is by way of illustration and example only and is not to be taken by way of limitation, the scope of the present invention being limited only by the terms of the appended claims.

What is claimed is:

1. A handling apparatus for a ceramic green sheet for separating a carrier film from a rectangular ceramic green sheet formed on said carrier film, said handling apparatus comprising:

an attracting head having an attracting surface for attracting said ceramic green sheet with said carrier film to said attracting surface;

a holding member for holding said carrier film at a position corresponding to one corner portion of said ceramic green sheet; and a mechanism for relatively moving said attracting head and said holding member diagonally or substantially diagonally with respect to said ceramic green sheet to separate said carrier film from said green sheet by folding back said carrier film directly over itself without any intervening member between said carrier film and said green sheet.

2. A handling apparatus for a ceramic green sheet in accordance with claim 1, further comprising a separating auxiliary plate, arranged in opposition to said attracting surface of said attracting head, for forcibly folding said carrier film back directly over itself through a folding line.

3. A handling apparatus for a ceramic green sheet in accordance with claim 2, wherein said folding line is arranged between said attracting head and said separation auxiliary plate.

4. A handling apparatus for a ceramic green sheet for separating a carrier film from a rectangular ceramic green sheet being formed on said carrier film, said handling apparatus comprising:

an attracting head having an attracting surface for attracting said ceramic green sheet with said carrier film to said attracting surface;

a holding member for holding said carrier film at a position corresponding to one corner portion of said ceramic green sheet; and a mechanism for relatively moving said attracting head and said holding member diagonally or substantially diagonally with respect to said ceramic green sheet to separate said carrier film from said green sheet by folding back said carrier film directly over itself without any intervening member between said carrier film and said green sheet, wherein said attracting head is further movable for stacking said ceramic green sheets separated from said carrier films successively on other separated ceramic green sheets.

5. A handling apparatus for a ceramic green sheet in accordance with claim 4, further comprising a separation auxiliary plate, arranged in opposition to said attracting surface of said attracting head, for forcibly folding said carrier film back directly over itself through a folding line.

6. A handling apparatus for a ceramic green sheet in accordance with claim 5, wherein said folding line is arranged between said attracting head and said separation auxiliary plate.

7. A handling apparatus for a ceramic green sheet in accordance with claim 4, wherein said relative moving mechanism comprises a mechanism for moving said attracting head in a first direction and a mechanism for moving said holding member in a second direction intersecting with said first direction.

8. A handling apparatus for a ceramic green sheet in accordance with claim 4, wherein said mechanism further moves said attracting head and said holding member to fold back said carrier film substantially parallel to itself.

* * * * *